(12) United States Patent
Yoon et al.

(10) Patent No.: US 10,601,381 B2
(45) Date of Patent: Mar. 24, 2020

(54) PHASE TUNING FOR MONOLITHIC MICROWAVE INTEGRATED CIRCUITS

(71) Applicant: Qorvo US, Inc., Greensboro, NC (US)

(72) Inventors: Soack Yoon, Torrance, CA (US); Ankush Mohan, Thousand Oaks, CA (US); Dan Denninghoff, Thousand Oaks, CA (US)

(73) Assignee: Qorvo US, Inc., Greensboro, NC (US)

( * ) Notice: Subject to any disclaimer, the term of this patent is extended or adjusted under 35 U.S.C. 154(b) by 0 days.

(21) Appl. No.: 16/042,351

(22) Filed: Jul. 23, 2018

(65) Prior Publication Data

US 2019/0068141 A1 Feb. 28, 2019

Related U.S. Application Data

(60) Provisional application No. 62/548,448, filed on Aug. 22, 2017.

(51) Int. Cl.
*H03F 3/21* (2006.01)
*H03F 3/195* (2006.01)
*H01P 5/02* (2006.01)
*H01P 5/12* (2006.01)
*H01P 3/06* (2006.01)
*H01P 1/18* (2006.01)

(52) U.S. Cl.
CPC .............. *H03F 3/211* (2013.01); *H01P 1/182* (2013.01); *H01P 3/06* (2013.01); *H01P 5/12* (2013.01); *H03F 3/195* (2013.01); *H01P 5/024* (2013.01)

(58) Field of Classification Search
USPC ............................ 330/295, 124 R, 286, 277
See application file for complete search history.

(56) References Cited

U.S. PATENT DOCUMENTS

| 4,234,854 | A | 11/1980 | Schellenberg et al. |
| 4,424,496 | A | 1/1984 | Nichols et al. |
| 5,036,335 | A | 7/1991 | Jairam |
| 5,214,394 | A | 5/1993 | Wong |
| 5,256,988 | A | 10/1993 | Izadian |

(Continued)

OTHER PUBLICATIONS

Author Unknown, "Interpack 2005: An assessment for PMMI members," 2005, PMMI, 32 pages.

(Continued)

*Primary Examiner* — Hieu P Nguyen
(74) *Attorney, Agent, or Firm* — Withrow & Terranova, P.L.L.C.

(57) ABSTRACT

Monolithic microwave integrated circuits (MMICs) with phase tuning are disclosed. A MMIC structure may include a MMIC amplifier with electrically coupled input and output lines. The MMIC structure may further include an adjustable cover over the MMIC amplifier that includes at least one portion that can be adjusted closer to or farther away from either the input or output lines. In this manner, a signal capacitance between the adjustable cover and the input or output lines is adjustable, and accordingly, a signal phase of the MMIC structure may be tuned. A spatial power-combining device may include a plurality of amplifier assemblies, wherein each amplifier assembly includes a MMIC amplifier with an adjustable cover. In this manner, the plurality of amplifier assemblies may be phase-tuned to a target value.

19 Claims, 9 Drawing Sheets

(56) References Cited

U.S. PATENT DOCUMENTS

| | | | |
|---|---|---|---|
| 5,736,908 | A | 4/1998 | Alexanian et al. |
| 5,920,240 | A | 7/1999 | Alexanian et al. |
| 6,028,483 | A | 2/2000 | Shealy et al. |
| 6,037,840 | A | 3/2000 | Myer |
| 6,181,221 | B1 | 1/2001 | Kich et al. |
| 6,828,875 | B2 | 12/2004 | Channabasappa et al. |
| 7,110,165 | B2 | 9/2006 | Martin et al. |
| 7,215,220 | B1 | 5/2007 | Jia |
| 7,466,203 | B2 * | 12/2008 | Rector .................. H03F 3/602 330/124 R |
| 8,698,577 | B2 * | 4/2014 | Sherrer ................... H01P 5/12 333/127 |
| 8,928,429 | B2 | 1/2015 | Song et al. |
| 9,019,036 | B2 | 4/2015 | Kolias et al. |
| 9,054,427 | B2 | 6/2015 | Guy et al. |
| 9,065,163 | B1 | 6/2015 | Wu et al. |
| 9,276,304 | B2 | 3/2016 | Behan et al. |
| 9,287,605 | B2 | 3/2016 | Daughenbaugh, Jr. et al. |
| 9,325,074 | B2 | 4/2016 | Chandler |
| 9,917,343 | B2 | 3/2018 | Chieh et al. |
| 9,954,706 | B1 | 4/2018 | Harris et al. |
| 10,003,118 | B2 | 6/2018 | Kitt |
| 10,009,067 | B2 | 6/2018 | Birk et al. |
| 10,164,667 | B1 | 12/2018 | Kitt |
| 2006/0202777 | A1 | 9/2006 | Deckman et al. |
| 2007/0229186 | A1 | 10/2007 | Hacker et al. |
| 2007/0279146 | A1 | 12/2007 | Rector |
| 2014/0145794 | A1 | 5/2014 | Courtney et al. |
| 2014/0167880 | A1 | 6/2014 | Daughenbaugh, Jr. et al. |
| 2017/0149113 | A1 | 5/2017 | Theveneau et al. |
| 2017/0179598 | A1 | 6/2017 | Kitt |
| 2018/0294539 | A1 | 10/2018 | Kitt |
| 2019/0007007 | A1 | 1/2019 | Kitt |
| 2019/0067778 | A1 | 2/2019 | Mohan |
| 2019/0067781 | A1 | 2/2019 | Mohan et al. |
| 2019/0067782 | A1 | 2/2019 | Mohan et al. |
| 2019/0067783 | A1 | 2/2019 | Mohan et al. |
| 2019/0067836 | A1 | 2/2019 | Mohan |
| 2019/0068123 | A1 | 2/2019 | Mohan et al. |
| 2019/0068140 | A1 | 2/2019 | Mohan et al. |

OTHER PUBLICATIONS

Caturla, F., et al., "Electroless Plating of Graphite with Copper and Nickel," Journal of the Electrochemical Soceity, vol. 142, Issue 12, Dec. 1995, The Electrochemical Society, Inc., pp. 4084-4090.

Fitzhugh, William, et al., "Modulation of Ionic Current Limitations by Doping Graphite Anodes," Journal of Electrochemical Society, vol. 165, Issue 10, Jul. 2018, The Electrochemical Society, 6 pages.

Larkins, Grover, et al., "Evidence of Superconductivity in Doped Graphite and Graphene," Superconductor Science and Technology, vol. 29, Issue 1, Dec. 2015, IOP Publishing Ltd, 18 pages.

Glenis, S., et al., "Sulfur doped graphite prepared via arc discharge of carbon rods in the presence of thiopenes," Journal of Applied Physics, vol. 86, Issue 8, Oct. 1999, American Institute of Physics, pp. 4464-4466.

Scheike, T., et al., "Can doping graphite trigger room temperature superconductivity: Evidence for granular high-temperature superconductivity in water-treated graphite powder," Advanced Materials, vol. 24, Issue 43, Sep. 2012, 19 pages.

Smalc, Martin, et al., "Thermal Performance of Natural Graphite Heat Spreaders," Proceedings of IPACK2005, Jul. 17-22, San Francisco, California, American Society of Mechanical Engineers, 11 pages.

Notice of Allowance for U.S. Appl. No. 15/637,472, dated Mar. 12, 2019, 7 pages.

Non-Final Office Action for U.S. Appl. No. 15/846,840, dated Mar. 21, 2019, 4 pages.

Non-Final Office Action for U.S. Appl. No. 15/637,472, dated Aug. 10, 2018, 8 pages.

Notice of Allowance for U.S. Appl. No. 15/927,565, dated Aug. 8, 2018, 8 pages.

U.S. Appl. No. 15/637,472, filed Jun. 29, 2017.
U.S. Appl. No. 15/845,225, filed Dec. 18, 2017.
U.S. Appl. No. 15/933,783, filed Mar. 23, 2018.
U.S. Appl. No. 16/032,252, filed Jul. 11, 2018.
U.S. Appl. No. 16/008,586, filed Jun. 14, 2018.
U.S. Appl. No. 15/846,840, filed Dec. 19, 2017.
U.S. Appl. No. 15/981,535, filed May 16, 2018.
U.S. Appl. No. 15/981,516, filed May 16, 2018.
U.S. Appl. No. 15/927,565, filed Mar. 21, 2018.
U.S. Appl. No. 15/933,821, filed Mar. 23, 2018.
U.S. Appl. No. 16/039,435, filed Jul. 19, 2018.

Author Unknown, "Spatial Combining Technology: Revolutionizing the Microwave Power Amplifier," Microwave Journal, Sep. 8, 2008, http://www.microwavejournal.com/articles/print/6838-spatial-combining, CAP Wireless Inc., 7 pages.

Author Unknown, "Vivaldi antenna," Wikipedia, web page last edited Feb. 7, 2017, accessed May 11, 2017, https://en.wikipedia.org/wiki/Vivaldi_antenna, Wikimedia Foundation, Inc., 2 pages.

Courtney, Patrick G. et al., "120 W Ka Band Power Amplifier Utilizing GaN MMICs and Coaxial Waveguide Spatial Power Combining," White Paper, May 2016, Qorvo, pp. 1-8.

Jia, Pengcheng et al., "Broadband High Power Amplifier using Spatial Power Combining Technique" IEEE Transactions on Microwave Theory and Techniques, vol. 51, Issue 12, Dec. 2003, IEEE, 4 pages.

Leggieri, Alberto et al., "The Squarax Spatial Power Combiner," Progress in Electromagnetics Research C, vol. 45, Oct. 2013, EMW Publishing, pp. 43-55.

Ortiz, Sean C., "High Power Spatial Combiners: Tile and Tray Approaches," Dissertation, North Carolina State University, Electrical Engineering, Nov. 2001, 194 pages.

Notice of Allowance for U.S. Appl. No. 15/290,749, dated Feb. 16, 2018, 9 pages.

Amjadi, S., et al., "Design of a Broadband Eight-Way Coaxial Wavelength Power Combiner," IEEE Transactions on Microwave Theory and Techniques, vol. 60, Issue 1, Nov. 15, 2011, pp. 39-45.

Beyers, R., et al., "Compact Conical-Line Power Combiner Design Using Circuit Models," IEEE Transactions on Microwave Theory and Techniques, vol. 62, Issue 11, Oct. 9, 2014, pp. 2650-2658.

Fathy, A., et al., "A Simplified Approach for Radial Power Combiners," IEEE Transactions on Microwave Theory and Techniques, vol. 54, No. 1, Jan. 2006, pp. 247-255.

Gharehkand, F., "Design of a 16 Way Radial Microwave Power Divider/Combiner with Rectangular Waveguide Output and Coaxial Inputs," International Journal of Electronics and Communications (AEU), vol. 68, 2014, pp. 422-428.

Tribak, A., et al., "Ultra-Broadband High Efficiency Mode Converter," Progress in Electromagnetics Research C, vol. 36, 2013, pp. 145-158.

Montgomery, R., et al., "Solid-State PAs Battle TWTAs for ECM Systems," Microwave Journal, Jun. 2017 Supplement, Jun. 14, 2017, 3 pages.

Möttönen, V. S., "Receiver Front-End Circuits and Components for Millimetre and Submillimetre Wavelengths," Dissertation for the degree of Doctor of Science in Technology, Helsinki University of Technology, Department of Electrical and Communications Engineering, Radio Laboratory, Apr. 2005, 40 pages.

Notice of Allowance for U.S. Appl. No. 15/845,225, dated Jan. 10, 2019, 7 pages.

Notice of Allowance for U.S. Appl. No. 16/166,548, dated Nov. 29, 2018, 8 pages.

Non-Final Office Action for U.S. Appl. No. 15/933,821, dated Jul. 11, 2019, 7 pages.

Non-Final Office Action for U.S. Appl. No. 15/981,516, dated Jul. 17, 2019, 5 pages.

Non-Final Office Action for U.S. Appl. No. 15/933,783, dated May 1, 2019, 8 pages.

Notice of Allowance for U.S. Appl. No. 15/846,840, dated Jul. 5, 2019, 7 pages.

Non-Final Office Action for U.S. Appl. No. 15/981,535, dated Jul. 8, 2019, 5 pages.

Non-Final Office Action for U.S. Appl. No. 16/005,794, dated Oct. 7, 2019, 11 pages.

(56) References Cited

OTHER PUBLICATIONS

Corrected Notice of Allowance and Examiner-Initiated Interview Summary for U.S. Appl. No. 15/846,840, dated Dec. 12, 2019, 6 pages.
Non-Final Office Action for U.S. Appl. No. 16/008,586, dated Oct. 24, 2019, 10 pages.
Non-Final Office Action for U.S. Appl. No. 16/191,541, dated Dec. 9, 2019, 7 pages.

* cited by examiner

PHASE TUNING FOR MONOLITHIC MICROWAVE INTEGRATED CIRCUITS

RELATED APPLICATION

This application claims the benefit of provisional patent application Ser. No. 62/548,448, filed Aug. 22, 2017, the disclosure of which is hereby incorporated herein by reference in its entirety.

FIELD OF THE DISCLOSURE

The disclosure relates generally to a monolithic microwave integrated circuit, and more particularly to phase tuning for a monolithic microwave integrated circuit for solid state power amplification.

BACKGROUND

Spatial power-combining devices, such as a Qorvo® Spatium® spatial power-combining device, are used for broadband radio frequency power amplification in commercial and defense communications, radar, electronic warfare, satellite, and various other communication systems. Spatial power-combining techniques are implemented by combining broadband signals from a number of amplifiers to provide output powers with high efficiencies and operating frequencies. One example of a spatial power-combining device utilizes a plurality of solid-state amplifier assemblies that form a coaxial waveguide to amplify an electromagnetic signal. Each amplifier assembly may include an input antenna structure, an amplifier, and an output antenna structure. When the amplifier assemblies are combined to form the coaxial waveguide, the input antenna structures may form an input antipodal antenna array, and the output antenna structures may form an output antipodal antenna array.

In operation, an electromagnetic signal is passed through an input port to an input coaxial waveguide section of the spatial power-combining device. The input coaxial waveguide section distributes the electromagnetic signal to be split across the input antipodal antenna array. The amplifiers receive the split signals and in turn transmit amplified split signals across the output antipodal antenna array. The output antipodal antenna array and an output coaxial waveguide section combine the amplified split signals to form an amplified electromagnetic signal that is passed to an output port of the spatial power-combining device.

The performance of spatial power-combining devices depends on a number of parameters, including the size and spacing of amplifier assemblies relative to each other. In particular, the size and spacing of amplifier assemblies in a coaxial arrangement about a center axis is relatively important for a given operating frequency range and bandwidth of the spatial power-combining device. If the spacing between the amplifier assemblies it too great, the device does not function; if the spacing between the amplifier assemblies is too close, there may be interference. Additionally, phase variation between amplifiers of different amplifier assemblies for a given operating frequency range may contribute to degradation of power-combining efficiency.

SUMMARY

Aspects disclosed herein relate to phase tuning for monolithic microwave integrated circuits (MMICs). A MMIC structure may include a MMIC amplifier with electrically coupled input and output lines. The MMIC structure may further include an adjustable cover over the MMIC amplifier that includes at least one portion that can be adjusted closer to or farther away from either the input or output lines. In this manner, a signal capacitance between the adjustable cover and the input or output lines is adjustable, and accordingly, a signal phase of the MMIC structure may be tuned. A spatial power-combining device may include a plurality of amplifier assemblies, wherein each amplifier assembly includes a MMIC amplifier with an adjustable cover. In this manner, the plurality of amplifier assemblies may be phase-tuned to a target value.

In some aspects, a MMIC structure includes a substrate; a MMIC amplifier on the substrate; an input line and an output line on the substrate, wherein the input line and the output line are electrically coupled to the MMIC amplifier; and an adjustable cover over the MMIC amplifier. In a first configuration, a portion of the adjustable cover includes a first spacing between the adjustable cover and the output line, and in a second configuration, the portion of the adjustable cover comprises a second spacing between the adjustable cover and the output line, wherein the second spacing is different than the first spacing. In some embodiments, the adjustable cover includes one or more tuning features that are integrated with the adjustable cover. The one or more tuning features may be configured to selectively adjust a profile of the adjustable cover. The one or more tuning features may be configured to selectively adjust a height of a gap between portions of the adjustable cover and the output line. In some embodiments, the one or more tuning features include at least one of screws, taps, or bolts.

In some embodiments, the MMIC structure further includes a housing, and the adjustable cover is mechanically secured to the housing. In some embodiments, a portion of the substrate, a portion of the input line, a portion of the output line, and the MMIC amplifier are between the adjustable cover and the housing. The MMIC structure may further include an input port configured to supply an input signal to the input line and an output port configured to receive an amplified signal from the output line. In some embodiments, the MMIC amplifier includes a gallium nitride based MMIC.

In some aspects, a spatial power-combining device includes an input coaxial waveguide section; an output coaxial waveguide section; and a center waveguide section including a plurality of amplifier assemblies. Each amplifier assembly includes an input line and an output line electrically connected to a MMIC amplifier; and an adjustable cover over the MMIC amplifier, wherein for a first configuration, a portion of the adjustable cover includes a first spacing between the adjustable cover and the output line, and in a second configuration, the portion of the adjustable cover includes a second spacing between the adjustable cover and the output line, wherein the second spacing is different than the first spacing. In some embodiments, the plurality of amplifier assemblies are arranged radially around a center axis.

In some embodiments, each amplifier assembly further includes an input antenna structure comprising an input signal conductor and an input ground conductor; and an output antenna structure comprising an output signal conductor and an output ground conductor. In some embodiments, the input line is an integral single component with the input signal conductor and the output line is an integral single component with the output signal conductor. The input coaxial waveguide section may include an input inner conductor and the output coaxial waveguide section may include an output inner conductor. In some embodiments, the plurality of amplifier assemblies form an input end and an output end, and the input inner conductor is mechanically attached to the input end and the output inner conductor is mechanically attached to the output end.

The spatial power-combining device may further include an input port for receiving a signal and an output port for transmitting an amplified signal. In some embodiments, the MMIC amplifier includes a gallium nitride based MMIC. In some aspects, a method for phase tuning a solid state power amplifier includes assembling a plurality of individual amplifier assemblies, wherein each individual amplifier assembly of the plurality of individual amplifier assemblies comprises a MMIC amplifier; phase tuning at least one individual amplifier assembly of the plurality of individual amplifier assemblies to a target value; and assembling the plurality of individual amplifier assemblies together to form a solid state power amplifier. In some embodiments, phase tuning the at least one individual amplifier assembly includes making adjustments to an adjustable cover that is provided over the MMIC amplifier. In some embodiments, the solid state power amplifier comprises a spatial power-combining device.

Those skilled in the art will appreciate the scope of the present disclosure and realize additional aspects thereof after reading the following detailed description of the preferred embodiments in association with the accompanying drawing figures.

BRIEF DESCRIPTION OF THE DRAWING FIGURES

The accompanying drawing figures incorporated in and forming a part of this specification illustrate several aspects of the disclosure, and together with the description serve to explain the principles of the disclosure.

DETAILED DESCRIPTION

The embodiments set forth below represent the necessary information to enable those skilled in the art to practice the embodiments and illustrate the best mode of practicing the embodiments. Upon reading the following description in light of the accompanying drawing figures, those skilled in the art will understand the concepts of the disclosure and will recognize applications of these concepts not particularly addressed herein. It should be understood that these concepts and applications fall within the scope of the disclosure and the accompanying claims.

It will be understood that, although the terms first, second, etc. may be used herein to describe various elements, these elements should not be limited by these terms. These terms are only used to distinguish one element from another. For example, a first element could be termed a second element, and, similarly, a second element could be termed a first element, without departing from the scope of the present disclosure. As used herein, the term "and/or" includes any and all combinations of one or more of the associated listed items.

It will be understood that when an element such as a layer, region, or substrate is referred to as being "on" or extending "onto" another element, it can be directly on or extend directly onto the other element or intervening elements may also be present. In contrast, when an element is referred to as being "directly on" or extending "directly onto" another element, there are no intervening elements present. Likewise, it will be understood that when an element such as a layer, region, or substrate is referred to as being "over" or extending "over" another element, it can be directly over or extend directly over the other element or intervening elements may also be present. In contrast, when an element is referred to as being "directly over" or extending "directly over" another element, there are no intervening elements present. It will also be understood that when an element is referred to as being "connected" or "coupled" to another element, it can be directly connected or coupled to the other element or intervening elements may be present. In contrast, when an element is referred to as being "directly connected" or "directly coupled" to another element, there are no intervening elements present.

Relative terms such as "below" or "above" or "upper" or "lower" or "horizontal" or "vertical" may be used herein to describe a relationship of one element, layer, or region to another element, layer, or region as illustrated in the Figures. It will be understood that these terms and those discussed above are intended to encompass different orientations of the device in addition to the orientation depicted in the Figures.

The terminology used herein is for the purpose of describing particular embodiments only and is not intended to be limiting of the disclosure. As used herein, the singular forms "a," "an," and "the" are intended to include the plural forms as well, unless the context clearly indicates otherwise. It will be further understood that the terms "comprises," "comprising," "includes," and/or "including" when used herein specify the presence of stated features, integers, steps, operations, elements, and/or components, but do not preclude the presence or addition of one or more other features, integers, steps, operations, elements, components, and/or groups thereof.

Unless otherwise defined, all terms (including technical and scientific terms) used herein have the same meaning as commonly understood by one of ordinary skill in the art to which this disclosure belongs. It will be further understood that terms used herein should be interpreted as having a meaning that is consistent with their meaning in the context of this specification and the relevant art and will not be interpreted in an idealized or overly formal sense unless expressly so defined herein.

Aspects disclosed herein relate to phase tuning for monolithic microwave integrated circuits (MMICs). A MMIC structure may include a MMIC amplifier with electrically coupled input and output lines. The MMIC structure may further include an adjustable cover over the MMIC amplifier that includes at least one cover portion that can be adjusted closer to or farther away from either the input or output lines. In this manner, a signal capacitance between the adjustable cover and the input or output lines is adjustable, and accordingly, a signal phase of the MMIC structure may be tuned. A spatial power-combining device may include a plurality of amplifier assemblies, wherein each amplifier assembly includes a MMIC amplifier with an adjustable cover. In this manner, the plurality of amplifier assemblies may be phase-tuned to a target value.

In some embodiments, an amplifier includes a MMIC amplifier that is a solid-state gallium nitride (GaN)-based MMIC. A GaN MMIC amplifier provides high power density and bandwidth with high power added efficiency and good linearity. Power-combining devices may combine power from a plurality of GaN MMIC amplifiers efficiently in a single step to minimize combining loss.

Figure 1:
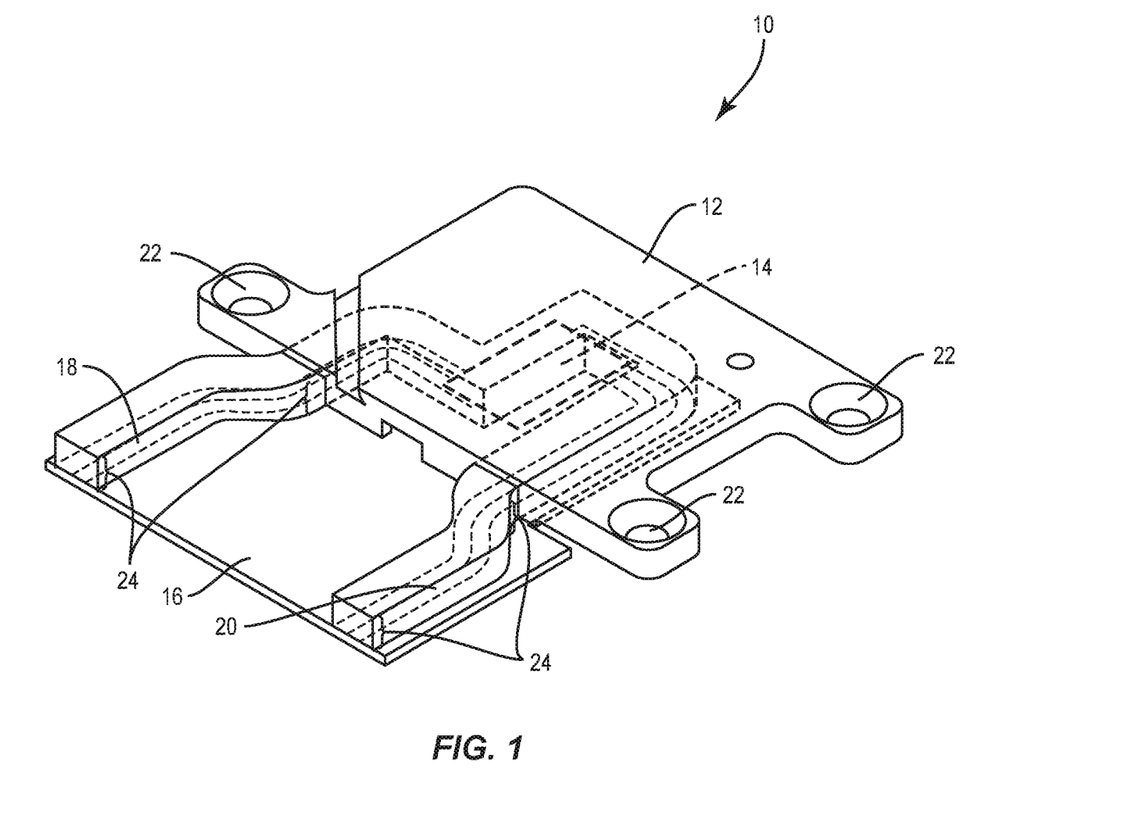
FIG. 1 is a perspective view of a monolithic microwave integrated circuit (MMIC) structure with a cover.

FIG. 1 is a perspective view of a MMIC structure 10 with a cover 12. The MMIC structure 10 includes a MMIC amplifier 14 on a substrate 16. The substrate 16 may include at least one of a printed circuit board, quartz, woven fiberglass, and/or other laminate materials. The MMIC structure 10 may also include an input line 18 and an output line 20 that are electrically coupled to the MMIC amplifier 14 for transmitting a signal to and from the MMIC amplifier 14. In some embodiments, the input line 18 and the output line 20 include one or more conductive metal layers that have been deposited on a surface of the substrate 16. In some embodiments, the input line 18 and the output line 20 may be referred to as input and output microstrip lines. In operation, the input line 18 transmits an input signal, such as a radio frequency (RF) signal, to the MMIC amplifier 14 for amplification, and the output line 20 receives an amplified signal from the MMIC amplifier 14. In some embodiments, the cover 12 is placed over the MMIC amplifier 14 and the substrate 16. In FIG. 1, the cover 12 is illustrated as transparent in order to better show the MMIC amplifier 14 and portions of the input line 18 and output line 20 that are underneath the cover 12. However, in some embodiments, the cover 12 is not transparent. In some embodiments, the cover 12 includes one or more mounting holes 22 for mounting the cover 12 to another structure (not shown), such as a housing. In such embodiments, the one or more mounting holes 22 are located in areas of the cover 12 that extend beyond lateral edges of the substrate 16. In other embodiments, the substrate 16 may be larger such that the cover 12 may be mounted to the substrate 16 via the mounting holes 22. The mounting holes 22 may be configured as screw holes for mechanical attachment of the cover 12. While the mounting holes 22 are shown, it is understood the cover 12 may be mounted by other mechanical connections, including snap-fit, press-fit, bolts and nuts, rivets, and clamps.

When the cover 12 is fixed in place, a gap 24 is formed between the cover 12 and the input line 18 as well as between the cover 12 and the output line 20. To illustrate the relative position, or height, of the cover 12 over the input line 18 and the output line 20, the gap 24 is represented as a three dimensional channel in FIG. 1 that extends from underneath the cover 12 to an edge of the substrate 16 that is outside of the cover 12. In some embodiments, the gap 24 comprises an air gap. When the cover 12 is fixed in place, the cover 12 is electrically grounded relative to the input line 18 and the output line 20. In that regard, for an RF signal, an RF signal capacitance is formed between the cover 12 and the input line 18 and the output line 20. A phase of the RF signal passing through the MMIC structure 10 is influenced by a number of factors including, among others: the original phase of the MMIC amplifier 14; the electrical connections between the MMIC amplifier 14 and the input line 18 and the output line 20; and the RF signal capacitance between the cover 12 and the input line 18 and the output line 20. Phase variation between different MMIC amplifiers is common and combined with additional factors introduced when assembling other components of an MMIC structure, it can be challenging to manufacture several different MMIC structures that are in phase with one another. A MMIC structure may be considered out of phase with another MMIC structure if the phase of signals passing through each MMIC structure have any phase variation with each other, such as a variation of greater than zero degrees. As phase variation between MMIC structures increases, such as above thirty degrees, a spatial power-combining device may experience a noticeable performance impact. For phase variation above sixty degrees, a spatial power-combining device may experience significant power loss. A conventional technique to address this involves binning MMIC amplifiers by narrow phase ranges before integration with the MMIC structures, which can be time consuming, costly, and reliant on the availability of MMIC amplifiers with matching phases within a distribution of MMIC amplifiers. Additionally, the other components of the MMIC structure have to be tightly controlled in order to prevent additional phase variation with other MMIC structures.

In some embodiments disclosed herein, a MMIC structure includes an adjustable cover that is configured to allow a RF signal capacitance between the cover and at least one of an input line and n output line to be adjustable. In this manner, the MMIC structure may be assembled and thereafter, a phase of the MMIC structure may be adjusted. In some embodiments, the adjustable cover includes one or more tuning features that are integrated with the adjustable cover. The one or more tuning features are configured to adjust a height of a gap between portions of the adjustable cover registered with the tuning features and at least one of the input and output lines.

Figure 2:
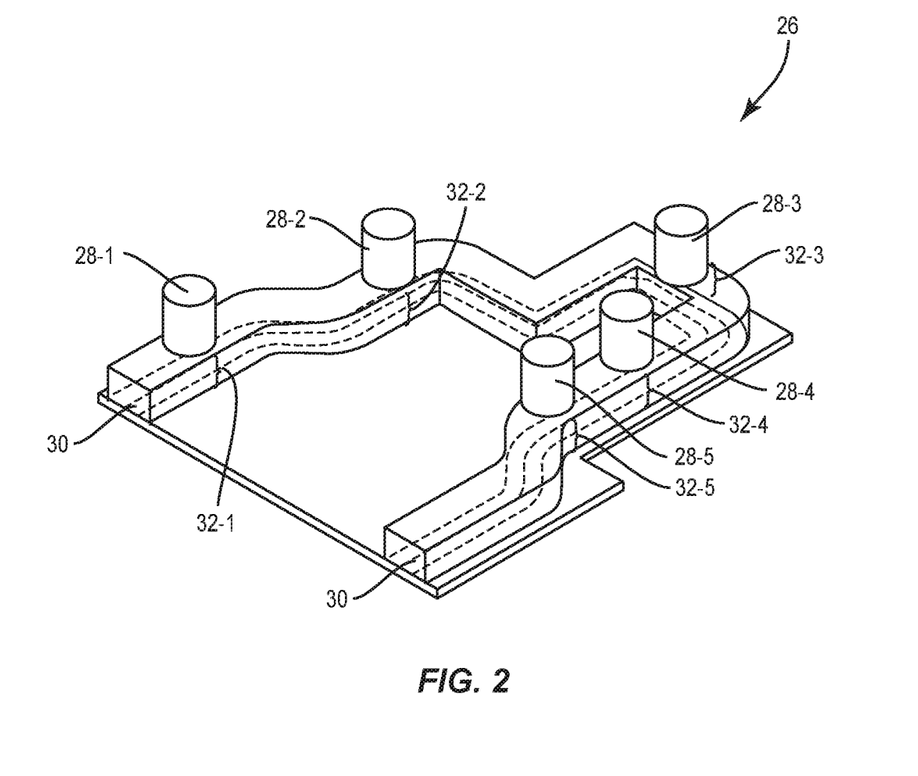
FIG. 2 is a perspective view of a model representation of tuning features configured over a transmission line for a radio frequency (RF) signal.

FIG. 2 is a perspective view of a model 26 representation of one or more tuning features 28-1 to 28-5 configured over a transmission line 30 for an RF signal. Each of the tuning features 28-1 to 28-5 forms a corresponding gap 32-1 to 32-5 between each tuning feature 28-1 to 28-5 and the transmission line 30. Combinations of the gaps 32-1 to 32-5 are represented as a three dimensional channel in a similar manner as in FIG. 1. For simplicity, a MMIC amplifier was omitted from the model 26. Simulations were run to demonstrate the phase and response of the RF signal through the model 26. The simulations included varying positions of the tuning features 28-1 to 28-5 to provide the gaps 32-1 to 32-5 of varying heights.

Figure 3:
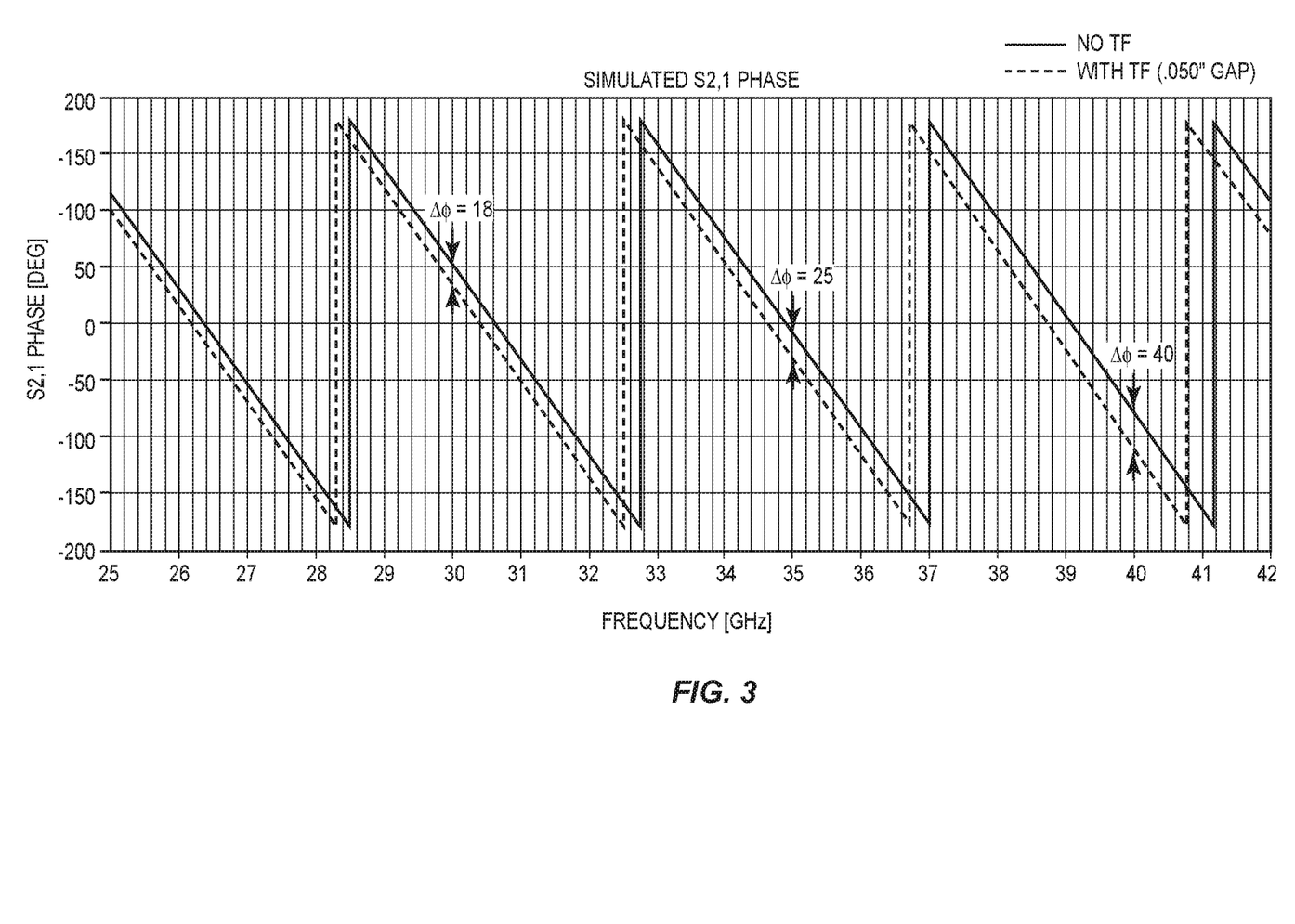
FIG. 3 is a plot representing simulation results for the model of FIG. 2.

FIG. 3 is a plot representing simulation results for the model 26 of FIG. 2. The simulation results show the angle of phase for scattering parameter (S-parameter) S2,1 in degrees (y-axis) by frequency in gigahertz (GHz) (x-axis). The plot includes simulation plots for a model that does not include tuning features (NO TF) and a model that includes the tuning features (28-1 to 28-5 of FIG. 2) that have been positioned to configure the corresponding gaps (32-1 to 32-5 of FIG. 2) with the transmission line (30 of FIG. 2). For the model with the tuning features (WITH TF (0.050" GAP)), the corresponding gap is configured to be about 0.050 inches from the transmission line, or about 0.03 inches closer than a gap without tuning features. The simulation results show it is possible to tune the phase of the RF signal by adjusting the gap or height of the tuning features 28-1 to 28-5 (FIG. 2) relative to the transmission line 30 (FIG. 2). For example, at a frequency of 30 GHz, the simulation results show the phase angle of the RF signal can be adjusted by a delta ($\Delta\phi$) of about 18 degrees. At a frequency of 35 GHz, the simulation results show the phase angle of the RF signal can be adjusted by a delta ($\Delta\phi$) of about 25 degrees. At a frequency of 40 GHz, the simulation results show the phase angle of the RF signal can be adjusted can be adjusted by a delta ($\Delta\phi$) of about 40 degrees.

Figure 4:
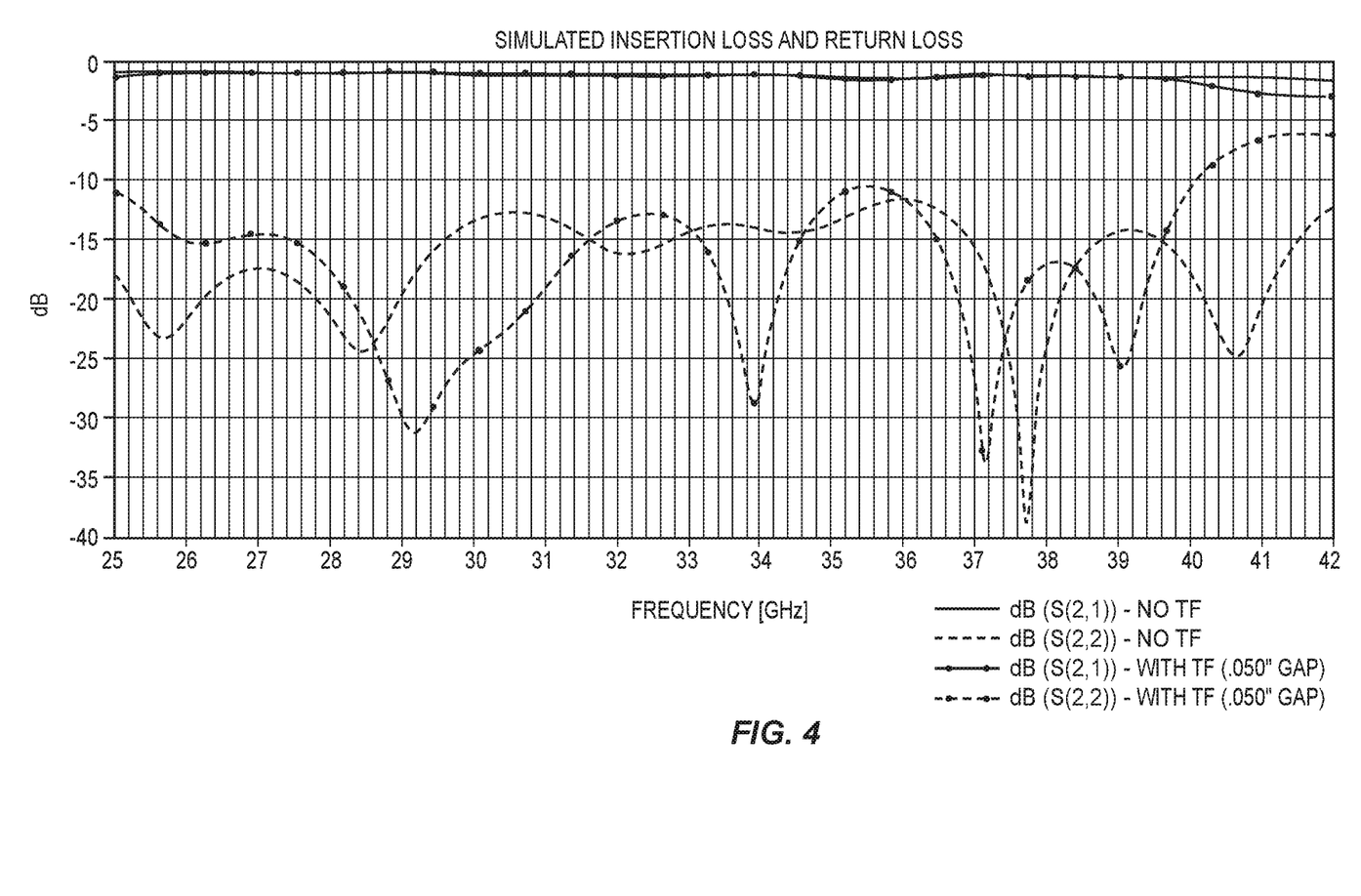
FIG. 4 is a scattering parameters (S-parameters) plot of the simulation results for the model of FIG. 2.

FIG. 4 is an S-parameters plot of the simulation results for the model 26 of FIG. 2. The S-parameter magnitude is plotted in decibels (dB) across a GHz frequency range. Return loss, in this case S2,2 or output return loss, is an indication of how much power is reflected. For frequencies where S2,2 is equal to 0 dB, then substantially all power from a RF signal is reflected. Insertion loss, in this case S2,1, is an indication of how much power is transferred. For frequencies where S2,1 is equal to 0 dB, then substantially all power from the RF signal is transferred. A return loss of at least −10 dB or lower is desirable for a target operating frequency range. S-parameters are plotted for S2,1 and S2,2 without tuning features (NO TF) and with tuning features configured to provide a gap of about 0.050 inches from the transmission line (WITH TF (0.050" GAP)). Accordingly, the simulation results show a desirable output return loss and insertion loss that can be realized with the presence of the tuning features 28-1 to 28-5 (FIG. 2). In this particular model, a desirable output return loss and insertion loss is realized across a frequency range of 25 GHz to 40 GHz.

Figure 5A:
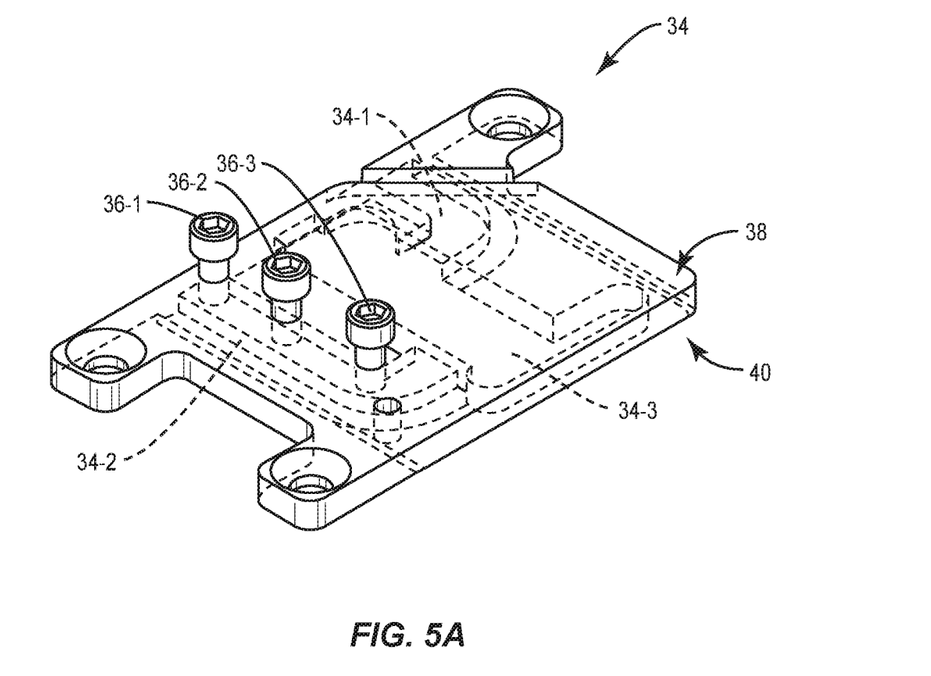
FIG. 5A is a perspective top view of a representative adjustable cover according to embodiments disclosed herein.
Figure 5B:
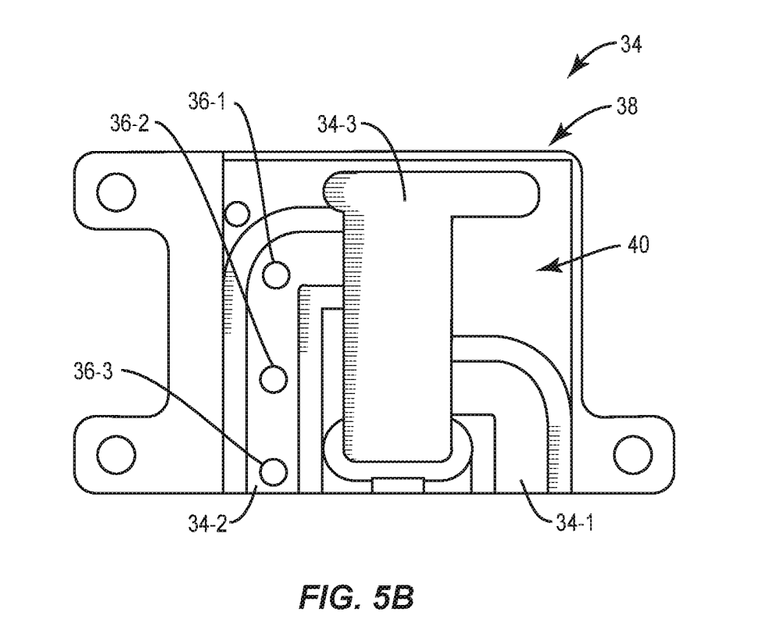
FIG. 5B is a bottom view of the adjustable cover of FIG. 5A.

FIG. 5A is a perspective top view of a representative adjustable cover 34 according to embodiments disclosed herein, and FIG. 5B is a bottom view of the adjustable cover 34 of FIG. 5A. The adjustable cover 34 includes one or more tuning features 36-1 to 36-3. The one or more tuning features 36-1 to 36-3 are integrated with the adjustable cover 34 and configured to selectively adjust a profile of the adjustable cover 34. The adjustable cover 34 includes a first surface 38 and a second surface 40 that generally opposes the first surface 38. In FIG. 5A, the perspective top view faces the first surface 38 and in FIG. 5B, the bottom view faces the second surface 40. On the second surface 40 visible in FIG. 5B, the adjustable cover 34 forms a profile that includes an input channel opening 34-1 and an output channel opening 34-2 on opposing sides of an amplifier opening 34-3. In FIG. 5A, the adjustable cover 34 is represented as transparent to also show three dimensional perspective views of the input channel opening 34-1, the output channel opening 34-2, and the amplifier opening 34-3 through the first surface 38; however, in practice, the adjustable cover may not be transparent. When assembled with an amplifier and corresponding input and output lines (not shown), the second surface 40 is configured closer to the amplifier and the corresponding input and output lines than the first surface 38. The amplifier opening 34-3 of the second surface 40 may cover the amplifier, and the input channel opening 34-1 and the output channel opening 34-2 may form gaps between the adjustable cover 34 and their respective input and output lines for the amplifier. In some embodiments, the one or more tuning features 36-1 to 36-3 are configured to protrude from the second surface 40. A distance the one or more tuning features 36-1 to 36-3 protrudes from the second surface 40 is separately adjustable, thereby allowing independent adjustment of a height of the gap between the adjustable cover 34 and the input and/or output lines. Accordingly, a profile of the second surface 40 is adjustable. In FIGS. 5A and 5B, the one or more tuning features 36-1 to 36-3 are configured to adjust a profile of the output channel opening 34-2. In other embodiments, one or more tuning features may be configured to adjust a profile of the input channel opening 34-1, or both of the input channel opening 34-1 and the output channel opening 34-2. In some embodiments, the one or more tuning features 36-1 to 36-3 comprise at least one of screws, taps, or bolts, which are configured to have adjustable heights or other positions relative to the adjustable cover 34.

Figure 6A:
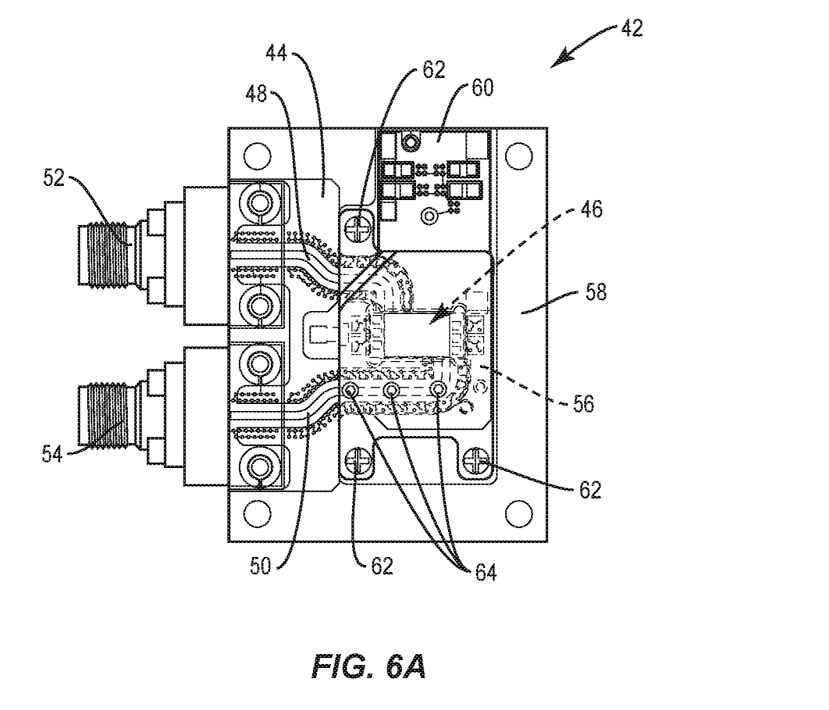
FIG. 6A is a top view of a MMIC structure according to embodiments disclosed herein.
Figure 6B:
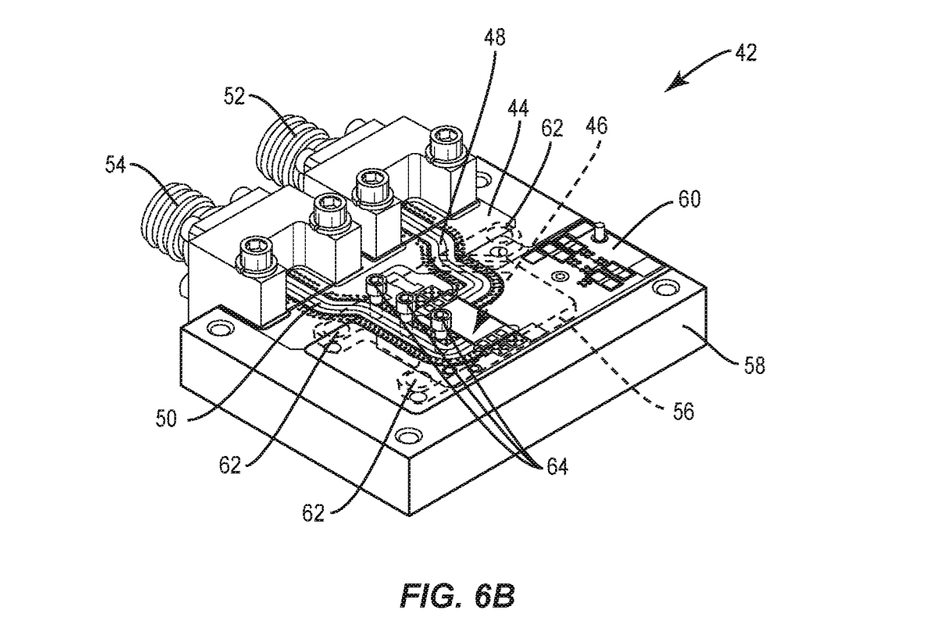
FIG. 6B is a perspective view of the MMIC structure of FIG. 6A.

FIG. 6A is a top view of a MMIC structure 42 according to embodiments disclosed herein, and FIG. 6B is a perspective view of the MMIC structure 42 of FIG. 6A. The MMIC structure 42 includes a substrate 44. In some embodiments, the substrate 44 includes a printed circuit board. The substrate 44 may also include at least one of quartz, woven fiberglass, and/or other laminate materials. A MMIC amplifier 46, an input line 48, and an output line 50 are included on the substrate 44. The input line 48 and the output line 50 are electrically coupled to the MMIC amplifier 46. An input port 52 is configured to supply an input signal to the input line 48, and an output port 54 is configured to receive an amplified signal from the output line 50. In some embodiments, the input port 52 and the output port 54 may be any type of coaxial or waveguide transition connector. The MMIC structure 42 further includes an adjustable cover 56 over the MMIC amplifier 46 and a portion of the substrate 44. As before, the adjustable cover 56 is represented as transparent for illustration purposes; however, in practice, the adjustable cover 56 may not be transparent. The adjustable cover 56 is mechanically secured to a housing 58 of the MMIC structure 42 in such a manner that a portion of the substrate 44, a portion of the input line 48, a portion of the output line 50, and the MMIC amplifier 46 are between the adjustable cover 56 and the housing 58. The housing 58 further supports a bias board 60 that is configured to provide drive power to the MMIC amplifier 46. In some embodiments, the bias board 60 is continuous with the substrate 44 that supports the MMIC amplifier 46, and in other embodiments, the bias board 60 is separate from the substrate 44. The bias board 60 is on an area of the housing 58 that is outside of the area covered by the adjustable cover 56. In FIGS. 6A and 6B, the adjustable cover 56 is secured to the housing 58 by a plurality of screws 62, although other mechanical fastening techniques could be used as previously described.

The adjustable cover 56 includes includes one or more tuning features 64 that are integrated with the adjustable cover 56. The one or more tuning features 64 are configured to selectively adjust a profile of the adjustable cover 56 as previously described. In some embodiments, the one or more tuning features 64 are configured to adjust a height of a gap between portions of the adjustable cover 56 and at least one of the input line 48 and the output line 50. In FIGS. 6A and 6B, the one or more tuning features 64 are configured to adjust the height of the gap over a portion of the output line 50 that is covered by the adjustable cover 56. For example, in a first configuration of the one or more tuning features 64, a portion of the adjustable cover 56 comprises a first spacing between the adjustable cover 56 and the output line 50. In a second configuration of the one or more tuning features 64, the portion of the adjustable cover 56 comprises a second spacing between the adjustable cover 56 and the output line 50, wherein the second spacing is different than the first spacing. In that manner, an RF signal capacitance between the adjustable cover 56 and the output line 50 may be adjusted to tune the phase of a signal passing through the MMIC structure 42. Notably, the phase tuning of the signal may be performed after assembly of the MMIC structure 42. In some embodiments, the one or more tuning features 64 may also be located over the input line 48 in a similar manner. In some embodiments, the one or more tuning features 64 are configured to adjust multiple portions of the adjustable cover 56.

The embodiments disclosed herein are particularly adapted to solid state power amplifiers, such as spatial power-combining devices or planar power-combining devices, which combine amplified signals from a plurality of amplifiers. In this manner, the plurality of amplifiers may be phase-tuned to a target value, thereby reducing phase variation between the amplifiers and improving power-combining efficiency. Additionally, the plurality of amplifiers do not require phase binning to tight value ranges before assembly. In some embodiments, spatial power-combining devices operate at microwave frequencies such as, by way of non-limiting example, energy between about 300 megahertz (MHz) (100 centimeters (cm) wavelength) and 300 GHz (0.1 cm wavelength). Additionally, embodiments may comprise operating frequency ranges that extend above microwave frequencies. A spatial power-combining device may operate within one or more common radar bands including, but not limited to S-band, C-band, X-band, Ku-band, K-band, Ka-band, and Q-band. In some embodiments, by way of non-limiting examples, the operating frequency range includes an operating bandwidth spread of 2 GHz to 20 GHz. In other embodiments, the operating frequency range includes an operating bandwidth spread of 4 GHz to 40 GHz.

A spatial power-combining device generally includes a plurality of amplifier assemblies, and each amplifier assembly is an individual signal path and includes an amplifier connected to an input antenna structure and an output antenna structure. An input coaxial waveguide is configured to provide a signal concurrently to each input antenna structure, and an output coaxial waveguide is configured to concurrently combine amplified signals from each output antenna structure. The plurality of amplifier assemblies are arranged coaxially about a center axis. Accordingly, the spatial power-combining device is configured to split, amplify, and combine an electromagnetic signal.

Figure 7:
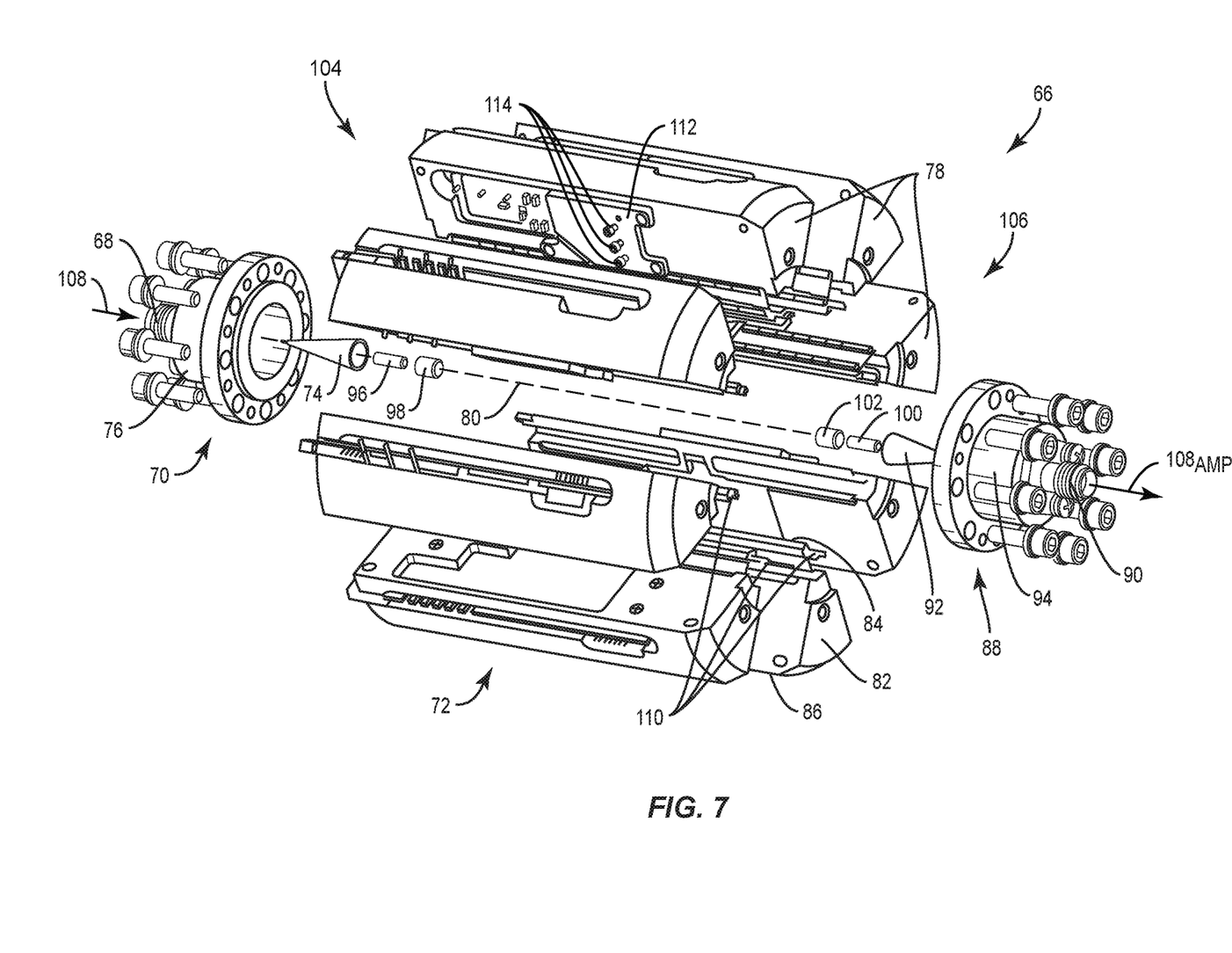
FIG. 7 is a perspective exploded view of a representative spatial power-combining device according to some embodiments.

FIG. 7 is a perspective exploded view of a representative spatial power-combining device 66 according to some embodiments. The spatial power-combining device 66 comprises an input port 68 and an input coaxial waveguide section 70. The input coaxial waveguide section 70 provides a broadband transition from the input port 68 to a center waveguide section 72. Electrically, the input coaxial waveguide section 70 provides broadband impedance matching from an impedance $Z_{p1}$ of the input port 68 to an impedance $Z_c$ of the center waveguide section 72. The input coaxial waveguide section 70 comprises an input inner conductor 74 and an input outer conductor 76. Outer surfaces of the input inner conductor 74 and inner surfaces of the input outer conductor 76 have gradually changed profiles configured to minimize the impedance mismatch from the input port 68 to the center waveguide section 72.

The center waveguide section 72 comprises a plurality of amplifier assemblies 78 arranged radially around a center axis 80 of the spatial power-combining device 66. Each amplifier assembly 78 comprises a body 82 having a predetermined wedge-shaped cross-section, an inner surface 84, and an arcuate outer surface 86. When the amplifier assemblies 78 are collectively assembled, they may form a cylinder with a cylindrical central cavity, defined by the inner surfaces 84. The body 82 is similar to the housing 58 of FIGS. 6A and 6B.

The spatial power-combining device 66 also comprises an output coaxial waveguide section 88 and an output port 90. The input port 68 and the output port 90 may comprise field-replaceable Subminiature A (SMA) connectors. In other embodiments, the input port 68 or the output port 90 may comprise at least one of a super SMA connector, a type N connector, a type K connector, a WR28 connector, other coaxial to waveguide transition connectors, or any other suitable coaxial or waveguide connectors. The output coaxial waveguide section 88 provides a broadband transition from the center waveguide section 72 to the output port 90. Electrically, the output coaxial waveguide section 88 provides broadband impedance matching from the impedance $Z_c$ of the center waveguide section 72 to an impedance $Z_{p2}$ of the output port 90. The output coaxial waveguide section 88 comprises an output inner conductor 92 and an output outer conductor 94. Outer surfaces of the output inner conductor 92 and inner surfaces of the output outer conductor 94 have gradually changed profiles configured to minimize the impedance mismatch from the output port 90 to the center waveguide section 72. In some embodiments, impedance matching is configured for 50 Ohms, although other designs such as 30 Ohms are possible. A first screw 96 and a first nut 98 are provided for mechanically attaching the input inner conductor 74 to the plurality of amplifier assemblies 78. In a similar manner, a second screw 100 and a second nut 102 are provided for mechanically attaching the output inner conductor 92 to the plurality of amplifier assemblies 78. The plurality of amplifier assemblies 78 comprise an input end 104 and an output end 106. The input inner conductor 74 is mechanically attached to the input end 104, and the output inner conductor 92 is mechanically attached to the output end 106. Accordingly, a spatial power-combining device 66 is provided that comprises a center waveguide section 72 comprising a plurality of amplifier assemblies 78, wherein the plurality of amplifier assemblies 78 forms an input end 104 and an output end 106, an input inner conductor 74 mechanically attached to the input end 104, and an output inner conductor 92 mechanically attached to the output end 106. In some embodiments, the input inner conductor 74 may be directly attached to the input end 104 and the output inner conductor 92 may be directly attached to the output end 106.

In other embodiments of spatial power-combining devices, inner conductors may be mechanically attached to a separate support element, such as a center post or rod. Amplifier assemblies may be stacked circumferentially around the center post and may have inner surfaces that conform to the outer shape of the center post. Accordingly, the center post is provided for mechanical support and assembly of the spatial power-combining device. As previously described, mechanical support in the spatial power-combining device 66 of FIG. 7 comprises mechanically attaching the input inner conductor 74 to the input end 104 of the plurality of amplifier assemblies 78 and mechanically attaching the output inner conductor 92 to the output end 106 of the plurality of amplifier assemblies 78. A separate support element, such as a center post or rod, is therefore not required for assembly. Removing the center post may have particular benefit for applications that include higher frequency operation with shorter wavelengths of electromagnetic radiation and increased bandwidth. For these applications, it may be preferable for the spatial power-combining device 66 to have smaller dimensions. Accordingly, spacing of the amplifier assemblies 78 relative to each other may be reduced around the center axis 80 without a center post present. In some applications, the operating frequency range includes an operating bandwidth spread of 4 GHz to 41 GHz. In other embodiments, such as those with an operating frequency range of 2 GHz to 20 GHz, a center post or rod may be present.

In operation, the input port 68 receives a signal 108, and the input coaxial waveguide section 70 is configured to provide the signal 108 concurrently to each of the amplifier assemblies 78 where the signal 108 is concurrently amplified by the respective amplifier assemblies 78. The output coaxial waveguide section 88 is configured to concurrently combine the amplified signals to form an amplified output signal $108_{AMP}$, which is propagated through the output coaxial waveguide section 88 to the output port 90 for transmitting the amplified output signal $108_{AMP}$.

According to some embodiments, the amplifier assemblies 78 each comprise an output connector portion 110 configured to mechanically attach to the output inner conductor 92. The output connector portions 110 comprise a shape, such as curved in FIG. 7, that when assembled, are configured to collectively attach with the output inner conductor 92. In a similar manner, the amplifier assemblies 78 may each comprise an input connector portion (not shown) configured to mechanically attach to the input inner conductor 74.

Each of the plurality of amplifier assemblies 78 further includes an adjustable cover 112 with one or more tuning features 114 as previously described. The tuning features 114 allow multiple configurations in order to selectively adjust a profile of the adjustable cover 112 that accordingly adjusts a signal phase of an amplifier underneath the adjustable cover 112. In FIG. 7, the spatial power-combining device 66 includes eight amplifier assemblies 78 to provide eight-way power-combining. Accordingly, signal phases of each of the eight amplifier assemblies 78 may be initially out of phase with each other and subsequently tuned in phase with each other by the adjustable covers 112. In other embodiments, a spatial power-combining device may include different numbers of amplifier assemblies, from as low as two amplifier assemblies to as many as sixteen amplifier assemblies or more.

Figure 8:
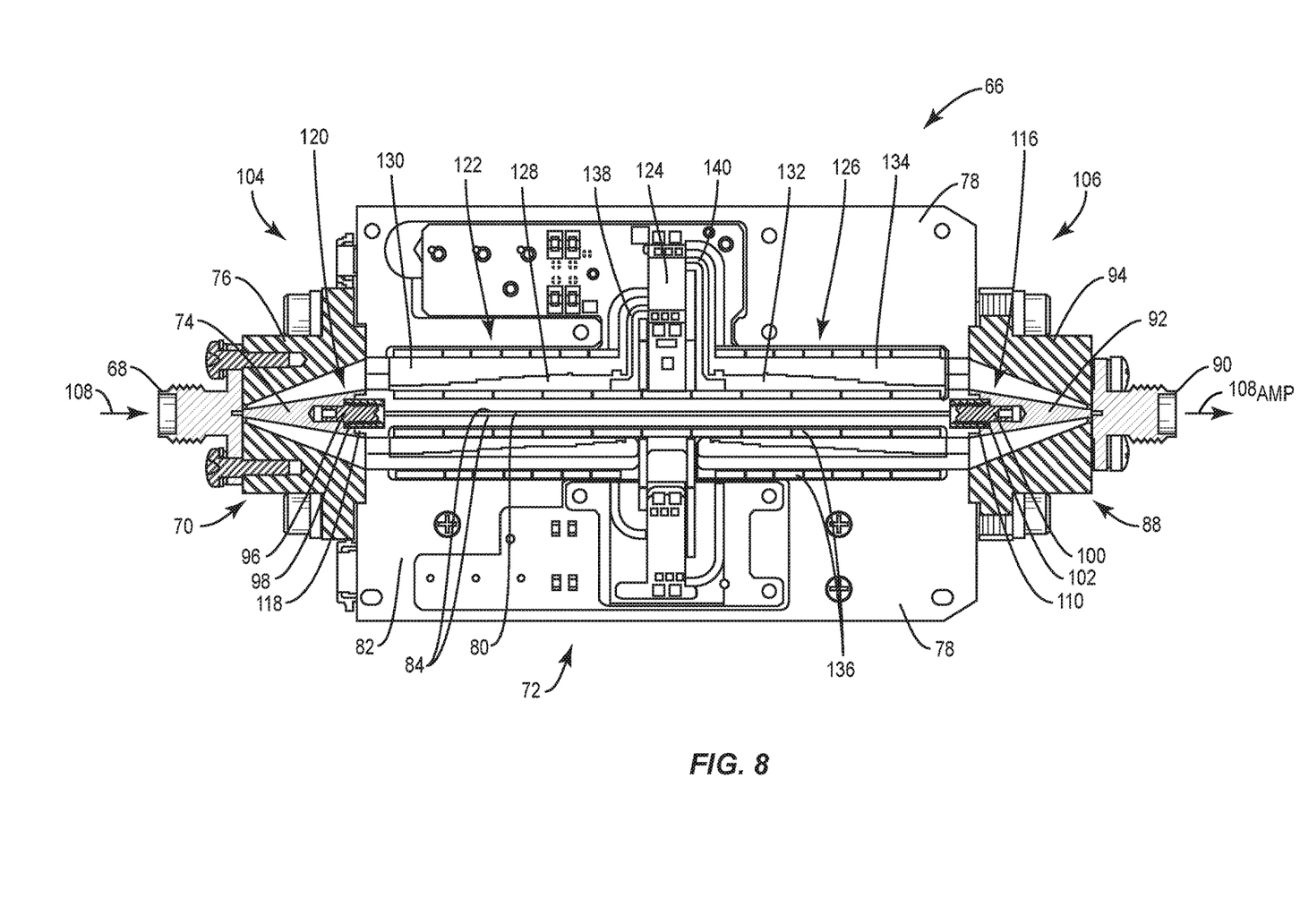
FIG. 8 is a partial and unexploded cross-sectional view of the spatial power-combining device of FIG. 7.

FIG. 8 is a partial and unexploded cross-sectional view of the spatial power-combining device 66 of FIG. 7. Several amplifier assemblies 78 are omitted to illustrate the following details. Both the input end 104 and the output end 106 of the plurality of amplifier assemblies 78 are visible within the center waveguide section 72. The input port 68 and the input coaxial waveguide section 70 are located adjacent the input end 104, and the output port 90 and the output coaxial waveguide section 88 are located adjacent the output end 106. The input coaxial waveguide section 70 comprises the input inner conductor 74 and the input outer conductor 76, and the output coaxial waveguide section 88 comprises the output inner conductor 92 and the output outer conductor 94. The output connector portions 110 of the plurality of amplifier assemblies 78 collectively form an output connector receptacle 116, and input connector portions 118 of the plurality of amplifier assemblies 78 collectively form an input connector receptacle 120. In some embodiments, the output connector receptacle 116 and the input connector receptacle 120 comprise a cylindrical shape, although other shapes are possible, including various polygonal shapes.

As shown, the input inner conductor 74 is configured to mechanically attach to the input end 104 at the input connector receptacle 120 by the first screw 96, and the output inner conductor 92 is configured to mechanically attach to the output end 106 at the output connector receptacle 116 by the second screw 100. The first nut 98 is inside the input connector receptacle 120 and is configured to receive the first screw 96, and the second nut 102 is inside the output connector receptacle 116 and is configured to receive the second screw 100. The mechanical attachment of the input inner conductor 74 and the output inner conductor 92 to the input end 104 and output end 106, respectively, allows the center axis 80 to be hollow, and thus the inner surface 84 of the body 82 of each amplifier assembly 78 is separated from the center axis 80 by empty space. For example, the inner surface 84 of each amplifier assembly 78 is separated from the center axis 80 completely by empty space, with no support structure in between. In some embodiments, the inner surface 84 of each amplifier assembly 78 is spaced from the center axis 80 by a distance of no more than 50 mil, and in further embodiments the spacing may be smaller. For example, the inner surface 84 of each amplifier assembly 78 may be spaced from the center axis 80 by a distance of about 10 mil. Amplifier assemblies in other spatial power-combining devices are not spaced from a center axis by a distance of 50 mil or less due to the presence of the center rod. For example, spatial power-combining devices with center rods typically have amplifier assemblies spaced from the center axis by at least 80 mil.

Accordingly, the spacing of the amplifier assemblies can be reduced to achieve higher frequency operation and increased bandwidth. In some applications, the operating frequency range includes an operating bandwidth spread of 4 GHz to 41 GHz. For such applications, the reduced spacing may only allow for a reduced number of amplifier assemblies. In some embodiments, the plurality of amplifier assemblies comprise fewer than ten amplifier assemblies. For the operating bandwidth spread of 4 GHz to 41 GHz, some embodiments may comprise eight amplifier assemblies and may therefore be referred to as an eight-way spatial power-combining device, as represented in FIG. 7. In other embodiments with a lower operating bandwidth spread, such as 2 GHz to 20 GHz, the spacing may be greater and more amplifier assemblies may be included.

As shown in FIG. 8, each amplifier assembly 78 comprises an input antenna structure 122, an amplifier 124, and an output antenna structure 126. In some embodiments, the amplifier 124 comprises a MMIC amplifier, such as a GaN-based MMIC. The input antenna structure 122 comprises an input antenna pattern, with an input signal conductor 128 visible in FIG. 8, supported on a first board 130. The output antenna structure 126 comprises an output antenna pattern, with an output signal conductor 132 visible in FIG. 8, supported on a second board 134. It is understood that the input antenna pattern may additionally include an input ground conductor on an opposite side of the first board 130, and the output antenna pattern may additionally comprise an output ground conductor on an opposite side of the second board 134. The first board 130 and the second board 134 may comprise substrates, such as printed circuit boards, that provide the desired form factor and mechanical support for the input antenna pattern and the output antenna pattern, respectively. Additionally, one or more electromagnetic interference filters 136 are supported on both the first board 130 and the second board 134. The electromagnetic interference filters 136 are located around the input antenna pattern and the output antenna pattern to help suppress modes and reduce leakage between the amplifier assemblies 78.

In operation, the signal 108 enters through the input port 68 and propagates through the input coaxial waveguide 70 to the input antenna structure 122 of each amplifier assembly 78. Each input antenna structure 122 couples the signal 108 to each amplifier 124, and each output antenna structure 126 couples the amplified signal $108_{AMP}$ to the output coaxial waveguide section 88 to be propagated to the output port 90. In FIG. 8, the adjustable cover 112 of FIG. 7 is removed to show the amplifier 124 as well as an input line 138 from the input antenna structure 122 and an output line 140 to the output antenna structure 126. The input line 138 and the output line 140 are electrically connected to the amplifier 124. In some embodiments, the input line 138 is continuous or an integral single component with the input signal conductor 128, and the output line 140 is continuous or an integral single component with the output signal conductor 132. In some embodiments, the tuning features (114 of FIG. 7) of the adjustable cover (122 of FIG. 7) are positioned over or aligned with the output line 140 to allow phase tuning of the amplifier 124 as previously described. In further embodiments additional tuning features may be positioned over or aligned with the input line 138 in a similar manner.

Figure 9:
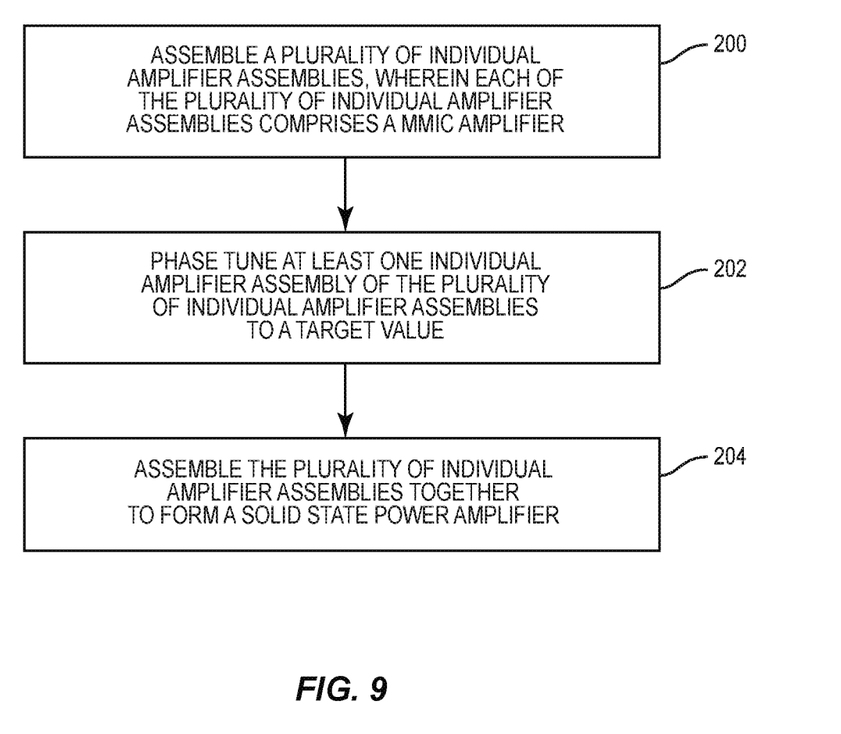
FIG. 9 is a flowchart of a method according to some embodiments disclosed herein.

FIG. 9 is a flowchart of a method according to some embodiments disclosed herein. The method includes assembling a plurality of individual amplifier assemblies that include a MMIC amplifier (block 200); phase tuning at least one individual amplifier assembly of the plurality of individual amplifier assemblies to a target value (block 202); and then assembling the plurality of individual amplifier assemblies together to form a solid state power amplifier (block 204). As previously described, the phase of a signal, such as an RF signal, passing through an amplifier assembly is influenced by a number of factors including, among others: the original phase of the MMIC amplifier; electrical connections that connect the MMIC amplifier between an input line and an output line; and a signal capacitance between an adjustable cover and the input line and the output line. In some embodiments, phase tuning at least one individual amplifier assembly includes making adjustments to the adjustable cover that is provided over the MMIC amplifier. Phase variation between different MMIC amplifiers is common and combined with the additional factors introduced when assembling the amplifier assemblies, it can be challenging to manufacture several different MMIC structures that are in phase with one another. According to methods described herein, a plurality of individual amplifier assemblies may be formed with MMIC amplifiers that are out of phase with each other. The plurality of individual amplifier assemblies may be separately phase-tuned to a target value by adjusting the adjustable cover as described herein. The plurality of now phase-tuned amplifier assemblies may then be joined together to form a solid state power amplifier. In this manner, a solid state power amplifier is provided with phase-tuned amplifier assemblies that are formed with at least some MMIC amplifiers that are originally out of phase with one another. In some embodiments, the solid state power amplifier includes a spatial power-combining device.

Those skilled in the art will recognize improvements and modifications to the preferred embodiments of the present disclosure. All such improvements and modifications are considered within the scope of the concepts disclosed herein and the claims that follow.

What is claimed is:

1. A monolithic microwave integrated circuit (MMIC) structure comprising:
    a substrate;
    a MMIC amplifier on the substrate;
    an input line and an output line on the substrate, wherein the input line and the output line are electrically coupled to the MMIC amplifier; and
    an adjustable cover over the MMIC amplifier, wherein:
        for a first configuration, a portion of the adjustable cover comprises a first spacing between the adjustable cover and the output line; and
        for a second configuration, the portion of the adjustable cover comprises a second spacing between the adjustable cover and the output line, wherein the second spacing is different than the first spacing.

2. The MMIC structure of claim 1 wherein the adjustable cover comprises one or more tuning features that are integrated with the adjustable cover.

3. The MMIC structure of claim 2 wherein the one or more tuning features are configured to selectively adjust a profile of the adjustable cover.

4. The MMIC structure of claim 2 wherein the one or more tuning features are configured to selectively adjust a height of a gap between portions of the adjustable cover and the output line.

5. The MMIC structure of claim 2 wherein the one or more tuning features comprise at least one of screws, taps, or bolts.

6. The MMIC structure of claim 1 further comprising a housing, wherein the adjustable cover is mechanically secured to the housing.

7. The MMIC structure of claim 6 wherein a portion of the substrate, a portion of the input line, a portion of the output line, and the MMIC amplifier are between the adjustable cover and the housing.

8. The MMIC structure of claim 1 further comprising an input port configured to supply an input signal to the input line and an output port configured to receive an amplified signal from the output line.

9. The MMIC structure of claim 1 wherein the MMIC amplifier comprises a gallium nitride based MMIC.

10. A spatial power-combining device comprising:
    an input coaxial waveguide section;
    an output coaxial waveguide section; and
    a center waveguide section comprising a plurality of amplifier assemblies, wherein each amplifier assembly comprises:
        an input line and an output line electrically connected to a monolithic microwave integrated circuit (MMIC) amplifier; and
        an adjustable cover over the MMIC amplifier, wherein for a first configuration, a portion of the adjustable cover comprises a first spacing between the adjustable cover and the output line, and in a second configuration, the portion of the adjustable cover comprises a second spacing between the adjustable cover and the output line, wherein the second spacing is different than the first spacing.

11. The spatial power-combining device of claim 10 wherein the plurality of amplifier assemblies are arranged radially around a center axis.

12. The spatial power-combining device of claim 10 wherein each amplifier assembly further comprises:
    an input antenna structure comprising an input signal conductor and an input ground conductor; and
    an output antenna structure comprising an output signal conductor and an output ground conductor.

13. The spatial power-combining device of claim 12 wherein the input line is an integral single component with the input signal conductor and the output line is an integral single component with the output signal conductor.

14. The spatial power-combining device of claim 10 wherein the input coaxial waveguide section comprises an input inner conductor and the output coaxial waveguide section comprises an output inner conductor.

15. The spatial power-combining device of claim 14 wherein the plurality of amplifier assemblies form an input end and an output end, and the input inner conductor is mechanically attached to the input end and the output inner conductor is mechanically attached to the output end.

16. The spatial power-combining device of claim 10 further comprising an input port for receiving a signal and an output port for transmitting an amplified signal.

17. The spatial power-combining device of claim 10 wherein the MMIC amplifier comprises a gallium nitride based MMIC.

18. A method for phase tuning a solid state power amplifier, the method comprising:
   assembling a plurality of individual amplifier assemblies, wherein each individual amplifier assembly of the plurality of individual amplifier assemblies comprises a monolithic microwave integrated circuit (MMIC) amplifier;
   phase tuning at least one individual amplifier assembly of the plurality of individual amplifier assemblies to a target value by making adjustments to an adjustable cover that is provided over the MMIC amplifier; and
   assembling the plurality of individual amplifier assemblies together to form a solid state power amplifier.

19. The method of claim 18 wherein the solid state power amplifier comprises a spatial power-combining device.

* * * * *